(12) United States Patent
Hahn et al.

(10) Patent No.: US 7,781,763 B2
(45) Date of Patent: Aug. 24, 2010

(54) COMPOSITION FOR FORMING PASSIVATION LAYER AND ORGANIC THIN FILM TRANSISTOR COMPRISING THE PASSIVATION LAYER

(75) Inventors: Jung Seok Hahn, Seongnam-si (KR); Do Hwan Kim, Seoul (KR); Bon Won Koo, Suwon-si (KR); Sang Yoon Lee, Seoul (KR); Hyun Sik Moon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 157 days.

(21) Appl. No.: 12/078,403

(22) Filed: Mar. 31, 2008

(65) Prior Publication Data
US 2009/0045396 A1 Feb. 19, 2009

(30) Foreign Application Priority Data
Aug. 14, 2007 (KR) .................. 10-2007-0081939

(51) Int. Cl.
*H01L 51/05* (2006.01)
*G03F 7/00* (2006.01)
*H01L 51/40* (2006.01)
*C08F 2/46* (2006.01)

(52) U.S. Cl. .................. 257/40; 257/E51.005; 438/99; 522/65; 522/68; 522/181; 430/311; 430/319; 252/62.3 R; 252/62.3 Q; 252/500

(58) Field of Classification Search .................. 257/40, 257/E51.005; 430/311, 319; 522/65, 68, 522/181; 438/99; 252/62.3 R, 62.3 Q, 500, 252/301.1, 401, 405, 407
See application file for complete search history.

(56) References Cited

U.S. PATENT DOCUMENTS 3,814,741 A 6/1974 Caporiccio
5,637,142 A 6/1997 Kubo et al.

(Continued)

FOREIGN PATENT DOCUMENTS

EP 1439421 7/2004

(Continued)

OTHER PUBLICATIONS

F. Haaf et al., "Polymers of N-Vinylpyrrolidone: Synthesis, Characterization and Uses", Polymer Journal, vol. 17, No. 1, pp. 143-152 (1985).

(Continued)

*Primary Examiner*—Victor A Mandala
*Assistant Examiner*—Whitney Moore
(74) *Attorney, Agent, or Firm*—Harness, Dickey & Pierce, P.L.C.

(57) ABSTRACT

Disclosed herein is a composition including a perfluoropolyether derivative, a photosensitive polymer or a copolymer thereof, and a photocuring agent, a passivation layer, organic thin film transistor, and electronic device including the same, a method of forming the passivation layer and methods of fabricating the organic thin film transistor and electronic device. The organic thin film transistor may prevent or reduce oxygen and moisture from infiltrating thereinto, and thus may prevent or reduce the degradation of the performance thereof caused by ambient air, prevent or reduce the deterioration thereof, and may more easily be formed into a pattern, thereby exhibiting characteristics suitable for use in electronics.

23 Claims, 2 Drawing Sheets

U.S. PATENT DOCUMENTS

| | | | |
|---|---|---|---|
| 5,965,659 A | 10/1999 | Kubo et al. | |
| 7,083,684 B2 * | 8/2006 | Fukuda et al. | 134/42 |
| 2004/0253547 A1 | 12/2004 | Endo et al. | |
| 2005/0194588 A1 * | 9/2005 | Sasaki et al. | 257/40 |
| 2006/0147722 A1 | 7/2006 | Ohashi et al. | |
| 2006/0202191 A1 | 9/2006 | Gerlach et al. | |
| 2008/0078990 A1 * | 4/2008 | Hahn et al. | 257/40 |

FOREIGN PATENT DOCUMENTS

| | | |
|---|---|---|
| WO | WO 03/040209 | 5/2003 |
| WO | WO 2005/044919 | 5/2005 |

OTHER PUBLICATIONS

Hagen Klauk et al., "Contact resistance in organic thin film transistors", Solid-State Electronics 47 (2003) 297-301.

* cited by examiner

COMPOSITION FOR FORMING PASSIVATION LAYER AND ORGANIC THIN FILM TRANSISTOR COMPRISING THE PASSIVATION LAYER

PRIORITY STATEMENT

This application claims priority under U.S.C. §119 to Korean Patent Application No. 10-2007-81939, filed on Aug. 14, 2007, in the Korean Intellectual Property Office (KIPO), the entire contents of which are incorporated herein by reference.

BACKGROUND

1. Field

Example embodiments relate to a composition, a passivation layer, organic thin film transistor, and electronic device including the same, a method of forming the passivation layer and methods of fabricating the organic thin film transistor and electronic device, and, more particularly, to a composition which may include a perfluoropolyether derivative and a photosensitive polymer, or a copolymer thereof, a passivation layer including the composition, an organic thin film transistor including the passivation layer, an electronic device including the organic thin film transistor, method of forming the passivation layer, and methods of fabricating the organic thin film transistor and electronic device.

2. Description of the Related Art

Recently, in the wide fields of electronic devices, and photonic devices, interest in the use of polymer materials as electric and electronic materials has increased because the polymer materials may be more easily molded into a fiber or a film, may be flexible, and may have improved electroconductivity and a decreased production cost. Because an organic thin film transistor, which may be an device manufactured using such electroconductive polymer materials, may be easily manufactured using relatively simple printing technologies, the production cost thereof may be decreased, and because the organic thin film transistor has improved processibility and compatibility with flexible substrates, research on organic thin film transistors is being actively conducted. Currently, an organic thin film transistor may be used for devices for driving active displays and plastic chips for smart cards and inventory tags.

Such an organic thin film transistor may be necessarily required to protect an organic semiconductor layer from ambient air, e.g., oxygen or moisture, by finally forming a passivation layer. Currently, there may be no effective method of forming a passivation layer on an organic thin film transistor. A method of forming a passivation layer using inorganic materials, e.g., SiNx, and SiOx, through a chemical vapor deposition method or a sputtering method has been attempted. This method may be advantageous in that the film quality may be improved, but may be problematic in that the interfacial characteristics of the organic semiconductor may be deteriorated, forming a pattern through a solution process may be difficult, and performing a vacuum process and a high-temperature process may be difficult. In particular, this method may be problematic in that an organic semiconductor active layer may be deteriorated by active gas or plasma, and thus the performance of the organic thin film transistor may rapidly worsen.

A method of forming a passivation layer using polyimide, benzocyclobutene (BCB), and photoacryl has been attempted. However, in this method, because the heat-treatment temperature may be about 150° C. or more, an organic active layer may be rapidly deteriorated at increased temperatures, and thus this method may not be an effective method for forming a passivation layer of an organic thin film transistor. In particular, the most important problem in the method of forming a passivation layer of an organic thin film transistor using an organic film may be that the materials for forming the passivation layer may directly come into contact with an organic active layer, and thus the deterioration of an organic semiconductor active layer may be accelerated by an organic solvent.

As an example of methods of effectively forming a passivation layer using an organic film, there may be a method of forming a passivation layer using polyvinyl alcohol (PVA). However, this method may be chiefly used as a method of patterning pentacene, used as an organic semiconductor active layer. Further, in this method, the charge mobility after processing may be rapidly decreased to about ⅓. Accordingly, when a passivation layer is formed using an organic film or an inorganic film through the above methods, there may be a limit in that the initial performance of an organic thin film transistor may be maintained.

SUMMARY

Accordingly, example embodiments have been made keeping in mind the above problems occurring in the prior art, and example embodiments provide a composition which prevents or reduces the infiltration of oxygen and moisture, and thus may constantly maintain the initial performance of an organic thin film transistor, prevent or reduce the degradation of an organic thin film, and be formed into patterns more easily.

Further, example embodiments provide a passivation layer and an organic thin film transistor and various electronic devices which include the passivation layer formed using the composition. Further, example embodiments provide a method of forming the passivation layer and methods of fabricating the organic thin film transistor and electronic device.

Example embodiments provide a composition including a perfluoropolyether derivative, represented by Chemical Formula 1 or 2, a photosensitive polymer, and a photocuring agent; or a copolymer of the perfluoropolyether derivative and the photosensitive polymer, and a photocuring agent.

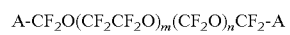  Chemical Formula 1

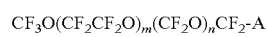  Chemical Formula 2 wherein A may be A' or RA', in which A' may be a functional group selected from the group consisting of COF, $SiX_1X_2X_3$ (where, each of $X_1$, $X_2$ and $X_3$ may be independently an alkyl group of about 1 to about 10 carbon atoms, and one or more of $X_1$, $X_2$ and $X_3$ may be alkoxy groups of about 1 to about 10 carbon atoms, respectively), silanol, chlorosilane, carboxylic acid, alcohol, amine, phosphoric acid, and derivatives thereof, and R may be a substituted or unsubstituted alkylene group of about 1 to about 30 carbon atoms, in which the substitution group may be selected from the group consisting of a hydroxy group, an alkyl group of about 1 to about 10 carbon atoms, a hydroxyalkyl group, an amide group, a nitro group, an alkenyl group of about 2 to about 30 carbon atoms, an alkoxy group of about 1 to about 30 carbon atoms, and an alkoxyalkyl group of about 2 to about 30 carbon atoms; m may be an integer of about 1 to about 50; and n may be an integer of about 1 to about 50.

Example embodiments provide a passivation layer and method of forming the same including applying the composition of example embodiments on a substrate to form a thin film, patterning the thin film through photolithography, and developing the patterned thin film.

Example embodiments provide an organic thin film transistor, comprising a substrate, a gate electrode, a gate insulation film, source/drain electrodes, an organic semiconductor layer and the passivation layer of example embodiments, and method of fabricating the same. Example embodiments provide an electronic device comprising the organic thin film transistor and method of fabricating the same.

BRIEF DESCRIPTION OF THE DRAWINGS

Example embodiments will be more clearly understood from the following detailed description taken in conjunction with the accompanying drawings.

FIG. 1 is a schematic sectional view showing an organic thin film transistor including a passivation layer formed using a method according to example embodiments;

FIGS. 2-3 are graphs showing the degradation in the characteristics of the organic thin film transistor manufactured in Comparative Examples 1 and 2, respectively, with the passage of time; and FIGS. 4-5 are graphs showing the change in the characteristics of the organic thin film transistor manufactured in Example 1, and manufactured in Example 1 and Comparative Examples 1 and 2, respectively, with the passage of time.

Figure 1:
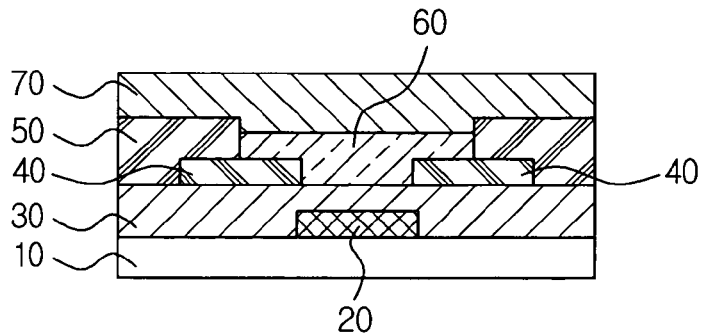
FIGS. 1-5 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, example embodiments will be described in detail with reference to the attached drawings. Reference now should be made to the drawings, in which the same reference numerals are used throughout the different drawings to designate the same or similar components. In the drawings, the thicknesses and widths of layers are exaggerated for clarity. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art.

In example embodiments, the term "photosensitive polymer" means a polymer including a photosensitive group decomposed or cross-linked by light, or a polymer formed into a photosensitive material by mixing the polymer with a photo-crosslinking agent.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example embodiments provide a composition including a perfluoropolyether derivative represented by Chemical Formula 1 or 2, a photosensitive polymer, and a photocuring agent; or a copolymer of the perfluoropolyether derivative and the photosensitive polymer, and a photocuring agent.

$$A\text{-}CF_2O(CF_2CF_2O)_m(CF_2O)_nCF_2\text{-}A \qquad \text{Chemical Formula 1}$$

$$CF_3O(CF_2CF_2O)_m(CF_2O)_nCF_2\text{-}A \qquad \text{Chemical Formula 2}$$

wherein A may be A' or RA', in which A' may be a functional group selected from the group consisting of COF, $SiX_1X_2X_3$ (where, each of $X_1$, $X_2$ and $X_3$ may be independently an alkyl group of about 1 to about 10 carbon atoms, and one or more of $X_1$, $X_2$ and $X_3$ may be alkoxy groups of about 1 to about 10 carbon atoms, respectively), silanol, chlorosilane, carboxylic acid, alcohol, amine, phosphoric acid, and derivatives thereof, and R may be a substituted or unsubstituted alkylene group of about 1 to about 30 carbon atoms, in which the substitution group may be selected from the group consisting of a hydroxy group, an alkyl group of about 1 to about 10 carbon atoms, a hydroxyalkyl group, an amide group, a nitro group, an alkenyl group of about 2 to about 30 carbon atoms, an alkoxy group of about 1 to about 30 carbon atoms, and an alkoxyalkyl group of about 2 to about 30 carbon atoms; m may be an integer of about 1 to about 50; and n may be an integer of about 1 to about 50.

The composition according to example embodiments may include a perfluoropolyether derivative, a photosensitive polymer, and a photocuring agent, or may include a copolymer of the photosensitive polymer and the perfluoropolyether derivative, and a photocuring agent. The perfluoropolyether derivative may have a weight-average molecular weight of about 1,000 to about 20,000.

Because the perfluoropolyether derivative, used in example embodiments, has lower surface free energy, the perfluoropolyether may have water repellency, oil repellency, chemical resistance, lubricity, a releasing property, an antifouling property, and, particularly, may have improved properties for preventing or reducing the infiltration of moisture and air. Further, A, represented in the above Chemical Formula 1, may function to enable the perfluoropolyether to form a strong and durable film.

A typical example of the perfluoropolyether derivative, represented by the above Chemical Formula 1, may be the compound represented by Chemical Formula 3 below.

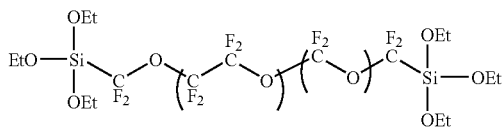

Chemical Formula 3

The photosensitive polymer, which may be used in example embodiments, may include one or more photosensitive groups on either or both of main chains or side chains thereof. In this case, the photosensitive group may not be limited, and may be any commonly-used photosensitive group. Examples of the photosensitive group may include acrylate, siloxane, imide, amide, vinyl, urethane, ester, epoxy, and alcohol.

The photosensitive polymer may be a water-soluble photosensitive polymer. Examples of the water-soluble photosensitive polymer may include, but are not limited to, polyvinyl alcohol, polyvinyl chloride, polyacryl amide, polyethylene glycol, polyethylene oxide, polymethyl vinyl ether, polyethylene imine, polyphenylenevinylene, polyaniline, polypyrrole, and copolymers thereof.

In example embodiments, the photosensitive polymer may have a weight-average molecular weight of about 500 to about 1,000,000, for example, about 20,000 to about 100,000. The mole equivalent ratio of the perfluoropolyether to the photosensitive polymer may be in the range of about 0.01 to about 1.0. In this case, a copolymer may be formed by copolymerizing the perfluoropolyether and the photosensitive polymer at the mole equivalent ratio, and the formed copolymer may be used in example embodiments.

When the mole equivalent ratio of the perfluoropolyether to the photosensitive polymer may be above about 1.0, crosslinkability may be decreased. Conversely, when the mole equivalent ratio thereof may be below about 0.01, surface selectivity may be decreased.

The copolymer of the perfluoropolyether and the photosensitive polymer may be prepared by polymerizing the perfluoropolyether and the photosensitive polymer in a solvent, e.g., water, using a commonly-used initiator.

The photocuring agent may function to accelerate the curing of a passivation layer through UV exposure. Examples of the photocuring agent that may be used in example embodiments may include, but are not limited to, ammonium dichromate, pentaerythritol triacrylate, urethane acrylate, and mixtures thereof.

When a water-soluble photosensitive polymer may be used as the photosensitive polymer, the possibility that an organic thin film deteriorates may be decreased by photo-exposing the water-soluble photosensitive polymer and then developing it with water. The water-soluble photosensitive polymer may be a polymer that has functional groups having increased affinity for water, e.g., —OH, —COOH, —NH$_2$, and —CONH$_2$, in the molecule thereof, and which may be dissolved in water because the polymer does not have crosslinking bonds. Therefore, when such a water-soluble photosensitive polymer may be used as the photosensitive polymer, a passivation layer may be formed without influencing the pixel region of an organic electronic device.

The photocuring agent, which may be used in the composition of example embodiments, may be added such that the ratio of the photocuring agent to the photosensitive polymer dissolved in deionized water may be in the range of about 0.01:1 to about 0.05:1, for example, about 0.02:1 to about 0.04:1, based on the solid content.

In the composition, in addition to the above essential constituents, if necessary, compatible polymers, and, particularly, various hydrophobic additives, e.g., colorants, plasticizers, surfactants, and coupling agents, may be properly added and combined. Teflon(R) solutions or Nafion(R) solutions may be used as the hydrophobic additives. These additives may be used independently or in combinations of two or more additives. The amount of other additives added may be determined by those skilled in the art to which example embodiments pertain. Example embodiments provide a passivation layer including the composition of example embodiments.

Example embodiments provide an organic thin film transistor, including a substrate, a gate electrode, a gate insulation film, source/drain electrodes, an organic semiconductor layer and the passivation layer of example embodiments and method of fabricating the same.

An organic thin film transistor may be of bottom contact or top contact type according to example embodiments. FIG. 1 is a schematic sectional view showing a bottom contact type organic thin film transistor including a passivation layer according to example embodiments. Referring to FIG. 1, the bottom contact type organic thin film transistor may include a substrate 10, a gate electrode 20 formed on the substrate 10, a gate insulation film 30 placed on the gate electrode 20, source/drain electrodes 40 formed on the gate insulation film 30, a bank 50 placed on the source/drain electrodes 40, an organic semiconductor layer 60 placed on the source/drain 40 and the gate insulation film 30, and a passivation layer 70 placed on the organic semiconductor layer 60 and the source/drain electrodes 40.

In the organic thin film transistor according to example embodiments, the passivation layer 70 may be formed on the uppermost portion of the organic thin film transistor such that the organic semiconductor layer 60 may be protected from ambient air. The passivation layer 70 may be formed only on the semiconductor active layer, and, when the organic thin film transistor includes the bank 50 formed on the source/drain electrodes 40, as shown in FIG. 1, the passivation layer 70 may be formed on the organic semiconductor layer 60 and the bank 50.

The passivation layer may be formed using a spin coating method, a dip coating method, a casting method, a micro-gravure coating method, a gravure coating method, a bar coating method, a roll coating method, a wire bar coating method, a spray coating method, a screen printing method, a flexographic printing method, an off-set printing method, or an ink-jet printing method. Examples of the solvent used for forming a film using the composition may include toluene, xylene, chloroform, and tetrahydrofuran.

The passivation layer may have a thickness of about 0.1 to about 5.0 μm, for example, about 0.5 to about 1.0 μm. When a light-emitting material, which may be activated by TFT (thin film transistor), may be layered on the passivation layer, the passivation layer may be sufficiently thick to cover the lower portion thereof, and simultaneously, the entire structure of TFT may not be unnecessarily thick. The substrate 10 may be selected from the group consisting of a glass substrate, a silicon substrate and a plastic substrate, but may be not limited thereto.

In the organic thin film transistor of example embodiments, the gate insulation film 30 may be formed of a material selected from the group consisting of polyvinyl phenol, polymethyl methacrylate, polyacrylate, polyvinyl alcohol, SiNx (0<x<4), $SiO_2$, $Al_2O_3$, and derivatives thereof, but may be not limited thereto.

The organic semiconductor layer 60 may be formed of a material selected from the group consisting of polythiophene, polyaniline, polyacetylene, polypyrrole, polyphenylenevinylene, and derivatives thereof, but may not be limited thereto.

Each of the gate electrode 20 and the source/drain electrodes 40 may be formed of a material selected from the group consisting of gold (Au), silver (Ag), aluminum (Al), nickel (Ni), molybdenum (Mo), tungsten (W), indium tin oxide (ITO), indium zinc oxide (IZO), polythiophene, polyaniline, polyacetylene, polypyrrole, polyphenylenevinylene, and polyethylenedioxythiophene (PEDOT)/polystyrenesulfonate (PSS), but may not be limited thereto.

Example embodiments provide a method of forming a passivation layer. When a passivation layer is formed using the method, the passivation layer may be formed by applying the composition of example embodiments on a substrate to form a thin film, patterning the thin film through photolithography, and then developing the patterned thin film. Hereinafter, the method of forming the passivation layer of example embodiments will be described in more detail.

The method of forming a passivation layer according to example embodiments may include applying the composition to a substrate to form a coating film, photo-exposing the coating film to form a polymer film, and developing the polymer film using a developer. If necessary, the method may further include a baking process.

Specifically, after the coating process, a drying process, a photo-exposure process and a developing process may be sequentially performed. The drying process may be performed using general drying methods. The photo-exposure process may be performed using a photomask. The light source for photo-exposure may not be limited as long as it may photosensitize the photosensitive group of the copolymer of example embodiments. For example, ultraviolet rays (UV), X-rays, an electron beam, an excimer laser ($F_2$, ArF, or KrF laser), and high-pressure mercury may be used as the light source. The energy required for photo-exposure may be suitably determined depending on the structure of photosensitive group and the actual energy of the light source. The photo-exposure process may be performed by UV radiation for about 10 to about 180 seconds using an ultraviolet lamp having a power of about 300 to about 500 W in the wavelength range of about 340 to about 400 nm.

The developer may not be limited as long as a sufficient difference in solubility between an unexposed region and an exposed region may be caused by the developer. Water or a mixed solution of water and an organic solvent compatible with water may be used as a solvent which may dissolve the unexposed region of a photosensitive polymer. Examples of the organic solvent compatible with water may include acetone, lower alcohols, e.g., methanol, acetonitrile, and tetrahydrofuran. Mixed solutions may be used as the developer.

When a process of forming a passivation layer may be performed using a composition including a water-soluble photosensitive polymer, the process of forming a passivation layer may be completed by exposing a polymer film with UV and then developing the exposed polymer film using deionized water. For example, the polymer film may be developed at room temperature for about 1 to about 5 minutes using the deionized water. After the developing process, if necessary, a baking process may be performed. For example, the baking process may be performed at a temperature of about 50 to about 150° C. for about 0.5 to about 2 hours using a hot plate.

The organic thin film transistor according to example embodiments may be used as a switching device for controlling the operation of each pixel and a driving device for driving each pixel in various flat panel displays, e.g., liquid crystal displays (LCDs), and electroluminescence displays (ELDs). In addition, the organic thin film transistor may be used for plastic chips for smart cards or inventory tags.

Hereinafter, example embodiments will be described in more detail with reference to Examples. Here, these Examples are set forth to illustrate example embodiments, but should not be construed as the limit of example embodiments.

EXAMPLE 1

First, a gate electrode having a thickness of about 1500 Å was formed on a cleaned glass substrate using aluminum (Al) through a sputtering method. Then, polyvinyl phenol was applied on the gate electrode to a thickness of about 4000 Å at a rotation speed of about 2000 rpm using a spin coating method, and was then baked at a temperature of about 70° C. for about 15 minutes, and at a temperature of about 180° C. for about 2 hours, thus forming an organic gate insulation film. Thereafter, gold (Au) was deposited on the organic gate insulation film to a thickness of about 700 Å under conditions of a vacuum of about $2\times10^{-7}$ torr and a deposition rate of about 5 Å/sec using a thermal evaporation method, and then an Au electrode pattern was formed through a photolithography process.

Subsequently, a bank was formed by applying photoacryl on the Au electrode using a spin-coating method. Thereafter, an organic semiconductor active layer was formed by layering polythiophene, which may be a semiconductor material, thereon using an ink spray method, and then a passivation layer was formed on the organic semiconductor active layer. The method of forming the passivation layer was conducted as follows.

First, ammonium dichromate, manufactured by Sigma Aldrich Corp., was added to a polyvinyl alcohol (PVA) solution, in which PVA may be dissolved in deionized water at a concentration of about 5% by weight such that the weight ratio of PVA to ammonium dichromate may be about 1:0.01 based on solid content. Subsequently, a perfluoropolyether-phosphate derivative (PT5045, manufactured by Solvay Solexis Corp.) was added to the mixed solution such that the volume ratio of the mixed solution to the perfluoropolyether-phosphate derivative may be about 85:15, thus preparing a composition.

Subsequently, the composition was spin-coated to a thickness of about 800 nm to form a coating film, and then the coating film was then dried. The surface of the coating film was irradiated with UV rays for about 20 seconds using an ultraviolet lamp having a power of about 400 W/cm$^3$ in the wavelength range of about 340 nm to about 400 nm. Subsequently, the coating film irradiated with UV was developed with deionized water at about room temperature for about 3 minutes, and was then baked in a hot plate at a temperature of about 150° C. for about 30 minutes, thereby obtaining an organic thin film transistor coated with a passivation layer.

A Composition Prepared Using a Copolymer and the Production of an Organic Thin Film Transistor Using the Composition Unlike Example 1, a composition of example embodiments may be prepared by preparing a copolymer of the perfluoroether-phosphate derivative and the photosensitive polymer and then mixing the copolymer with a photocuring agent.

First, the copolymer may be obtained by mixing PFPE-Si(OEt)$_3$, represented by Chemical Formula 3, with polyvinyl alcohol, manufactured by Kanto Chemical Co. such that the mole equivalent ratio of PFPE-Si(OEt)$_3$ to polyvinyl alcohol may be about 1:0.01, stirring the mixture, extracting a copolymer from the mixture using a fluorine-based organic solvent (Bertrel XF$^R$ D, manufactured by DuPont Co.), and then cleaning the copolymer.

Next, the obtained copolymer may be mixed with ammonium dichromate, manufactured by Sigma Aldrich Corp., such that the weight ratio of PVA included in the copolymer to the ammonium dichromate may be about 1:0.01, thus obtaining the composition.

Consequently, an organic thin film transistor may be manufactured using the same method as in Example 1, except that the organic thin film transistor may be manufactured using the composition including the copolymer.

COMPARATIVE EXAMPLE 1

An organic thin film transistor was manufactured using the same method as in Example 1, except that a passivation layer was not formed on an organic semiconductor layer.

COMPARATIVE EXAMPLE 2

An organic thin film transistor was obtained using the same method as in Example 1, except that a passivation layer was formed on an organic semiconductor layer using a commonly-used acrylate resin.

EXPERIMENTAL EXAMPLE

In the organic thin film transistor manufactured in Example 1 and Comparative Examples 1 and 2, in order to evaluate the electrical characteristics thereof with the change of time, the current transfer characteristics thereof were measured using a Keithley semiconductor characterization system (4200-SCS), and the results thereof were shown in FIGS. 2 to 5, respectively.

The charge mobility of the organic thin film transistor was obtained from the slope of the graph, which may be plotted with variables $(I_{SD})^{1/2}$ and $V_G$ from the following Current Equation in saturation region.

$$I_{SD} = \frac{WC_0}{2L}\mu(V_G - V_T)^2$$

$$\sqrt{I_{SD}} = \sqrt{\frac{\mu C_0 W}{2L}} (V_G - V_T)$$

$$\text{slope} = \sqrt{\frac{\mu C_0 W}{2L}}$$

$$\mu_{FET} = (\text{slope})^2 \frac{2L}{C_0 W} \ldots \text{Current Equation in saturation region}$$

In this Current Equation, $I_{SD}$ may be source-drain current, $\mu$ or $\mu_{FET}$ may be charge mobility, $C_o$ may be the capacitance of oxide film, W may be channel width, L may be channel length, $V_G$ may be gate voltage, and $V_T$ may be threshold voltage.

Threshold voltage ($V_T$) was obtained in such a way that a graph may be plotted with variables $(I_{SD})^{1/2}$ and $V_G$ from the above Current Equation in saturation region, and a value indicated by the point on the $V_G$ abscissa where the extended line of the linear portion of the current transfer curve intersects the $V_G$ abscissa may be obtained. When the absolute value of the threshold voltage is about 0, power consumption may be reduced.

Figure 2:
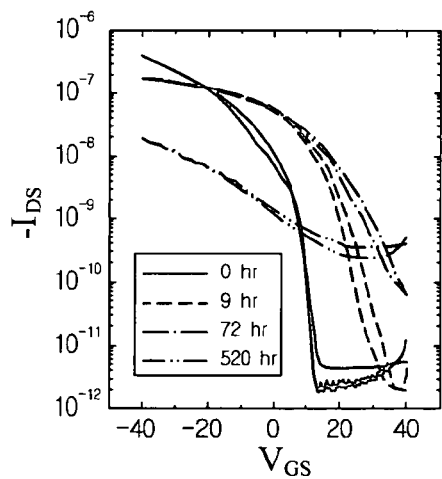
Figure 2:
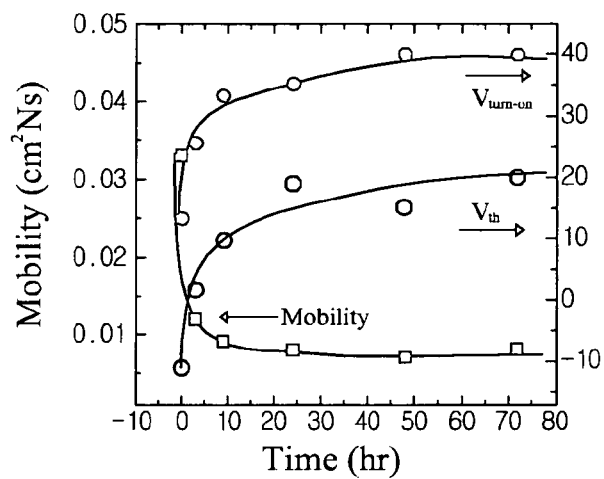
Figure 3:
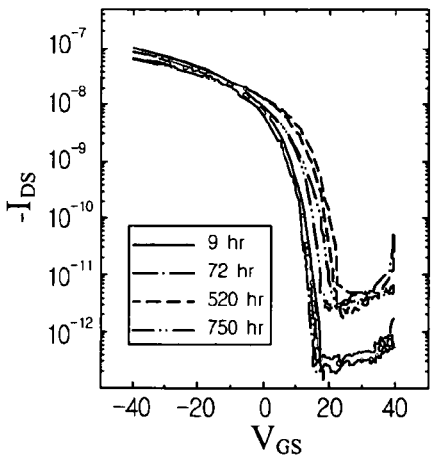
Figure 3:
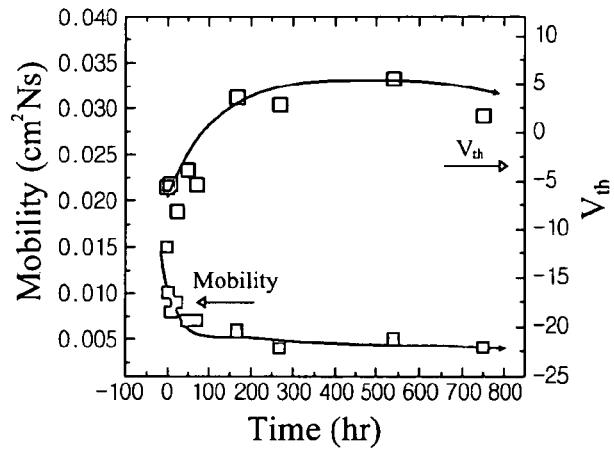
Figure 4:
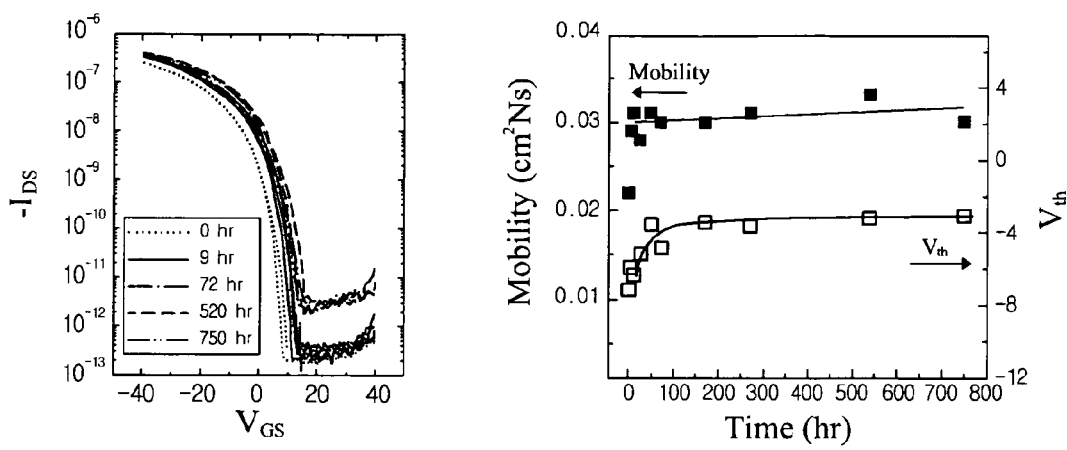
Figure 5:
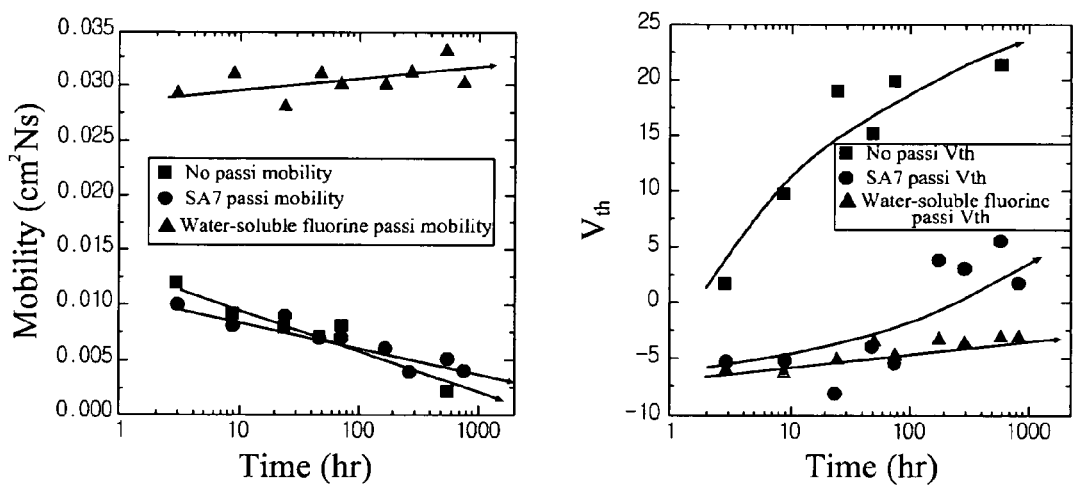

FIG. 2 is a graph showing the degradation in the characteristics of the organic thin film transistor manufactured in Comparative Example 1 with the passage of time, FIG. 3 is graphs showing the degradation in the characteristics of the organic thin film transistor manufactured in Comparative Example 2 with the passage of time, FIG. 4 is a graph showing the change in the characteristics of the organic thin film transistor manufactured in Example 1 with the passage of time, and FIG. 5 is a graph showing the change in the charge mobility and threshold voltage of the organic thin film transistors manufactured in Example 1 and Comparative Example 1 and 2 with the passage of time.

Referring to FIGS. 2 to 5, in Comparative Example 1, the absolute value of the threshold voltage was increased by about 25 V or more even after about 72 hours, and, in Comparative Example 2, the absolute value thereof was increased by about 10 V after about 520 hours. In contrast, in Example 1, the absolute value thereof was increased by only about 5 V, and thus it may be seen that the change in threshold voltage may be small. Compared with the charge mobility of the organic thin film transistor, in Comparative Example 1, the charge mobility thereof was rapidly decreased even after about 9 hours, and, in Comparative Example 2, the charge mobility thereof was decreased to about ⅓. In contrast, in Example 1, the charge mobility thereof changed little even after about 750 hours. As shown in FIGS. 2 to 6, in Example 1, the charge mobility and threshold voltage of the organic thin film transistor changed little with the passage of time. Therefore, the initial performance of the organic thin film transistor may be maintained constant.

As described above, because the composition according to example embodiments may include perfluoropolyether, which may be a fluorine surface preparation agent, and a photosensitive polymer, or a copolymer thereof, the composition may prevent or reduce the infiltration of oxygen and moisture, and thus may prevent or reduce the degradation of the performance thereof caused by ambient air, prevent or reduce the deterioration thereof, and may more easily form a pattern.

As described above, although example embodiments have been disclosed for illustrative purposes, those skilled in the art will appreciate that various modifications, additions and substitutions may be possible, without departing from the scope and spirit of the accompanying claims.

What is claimed is:

1. An organic thin film transistor, comprising:
a substrate, a gate electrode, a gate insulation film, source/drain electrodes, an organic semiconductor layer, and a passivation layer including a composition further including a perfluoropolyether derivative, represented by Chemical Formula 1 or 2, a photosensitive polymer, and a photocuring agent; or a copolymer of the perfluoropolyether derivative and the photosensitive polymer, and the photocuring agent;

$$A\text{-}CF_2O(CF_2CF_2O)_m(CF_2O)_nCF_2\text{-}A \quad \text{Chemical Formula 1}$$

$$CF_3O(CF_2CF_2O)_m(CF_2O)_nCF_2\text{-}A \quad \text{Chemical Formula 2}$$

wherein A is A' or RA', in which A' is a functional group selected from the group consisting of COF, $SiX_1X_2X_3$ (where each of $X_1$, $X_2$ and $X_3$ is independently an alkyl group of about 1 to about 10 carbon atoms, and one or more of $X_1$, $X_2$ and $X_3$ are alkoxy groups of about 1 to about 10 carbon atoms, respectively), silanol, chlorosilane, carboxylic acid, alcohol, amine, phosphoric acid, and derivatives thereof, and R is a substituted or unsubstituted alkylene group of about 1 to about 30 carbon atoms, in which the substitution group is selected from the group consisting of a hydroxy group, an alkyl group of about 1 to about 10 carbon atoms, a hydroxyalkyl group, an amide group, a nitro group, an alkenyl group of about 2 to about 30 carbon atoms, an alkoxy group of about 1 to about 30 carbon atoms, and an alkoxyalkyl group of about 2 to about 30 carbon atoms;

m is an integer of about 1 to about 50; and
n is an integer of about 1 to about 50.

2. The organic thin film transistor according to claim 1, wherein the photosensitive polymer includes one or more photosensitive groups selected from among acrylate, siloxane, imide, amide, vinyl, urethane, ester, epoxy, and alcohol on one or more of main chains or side chains thereof.

3. The organic thin film transistor according to claim 1, wherein the photosensitive polymer is a water-soluble photosensitive polymer.

4. The organic thin film transistor according to claim 3, wherein the photosensitive polymer is one or more selected from the group consisting of polyvinyl alcohol, polyvinyl chloride, polyacryl amide, polyethylene glycol, polyethylene oxide, polymethyl vinyl ether, polyethylene imine, polyphenylenevinylene, polyaniline, polypyrrole, and copolymers thereof.

5. The organic thin film transistor according to claim 1, wherein the perfluoropolyether derivative has a weight-average molecular weight of about 1,000 to about 20,000.

6. The organic thin film transistor according to claim 1, wherein, in the perfluoropolyether and the photosensitive polymer, or the copolymers thereof, an equivalent ratio of the perfluoropolyether to the photosensitive polymer is in the range of about 0.01 to about 1.0.

7. The organic thin film transistor according to claim 1, wherein the photocuring agent is added such that a ratio of the photocuring agent to the photosensitive polymer dissolved in deionized water is in the range of about 0.01:1 to about 0.05:1, based on solid content.

8. The organic thin film transistor according to claim 1, wherein the photocuring agent is one or more selected from the group consisting of ammonium dichromate, pentaerythritol triacrylate, and urethane acrylate.

9. The organic thin film transistor according to claim 1, wherein the passivation layer is on the uppermost portion of the organic thin film transistor.

10. The organic thin film transistor according to claim 1, wherein the passivation layer is on the organic semiconductor layer.

11. The organic thin film transistor according to claim 1, further comprising:
a bank on the source/drain electrodes, wherein the passivation layer is on the organic semiconductor layer and the bank.

12. The organic thin film transistor according to claim 1, wherein the passivation layer is formed using a spin coating method, a dip coating method, a casting method, a microgravure coating method, a gravure coating method, a bar coating method, a roll coating method, a wire bar coating method, a spray coating method, a screen printing method, a flexographic printing method, an off-set printing method, or an ink-jet printing method.

13. The organic thin film transistor according to claim 1, wherein the passivation layer has a thickness of about 0.1 to about 5.0 μm.

14. The organic thin film transistor according to claim 1, wherein the substrate is one or more selected from the group consisting of a glass substrate, a silicon substrate, and a plastic substrate.

15. The organic thin film transistor according to claim 1, wherein the gate insulation film is formed of one or more selected from the group consisting of polyvinyl phenol, polymethyl methacrylate, polyacrylate, polyvinyl alcohol, SiNx (0<x<4), $SiO_2$, $Al_2O_3$, and derivatives thereof.

16. The organic thin film transistor according to claim 1, wherein the organic semiconductor layer is formed of one or more selected from the group consisting of polythiophene, polyaniline, polyacetylene, polypyrrole, polyphenylenevinylene, and derivatives thereof.

17. The organic thin film transistor according to claim 1, wherein each of the gate electrode and the source/drain electrodes is formed of one or more selected from the group consisting of gold (Au), silver (Ag), aluminum (Al), nickel (Ni), molybdenum (Mo), tungsten (W), indium tin oxide (ITO), indium zinc oxide (IZO), polythiophene, polyaniline, polyacetylene, polypyrrole, polyphenylenevinylene, and polyethylenedioxythiophene (PEDOT) /polystyrenesulfonate(PSS).

18. An electronic device comprising the organic thin film transistor according to claim 1.

19. The electronic device according to claim 18, wherein the electronic device is one or more selected from the group including liquid crystal displays (LCDs), electroluminescence displays (ELDs), and plastic chips for smart cards or inventory tags.

20. A method of forming a passivation layer comprising:
applying a composition on a substrate to form a thin film, the composition including a perfluoropolyether derivative, represented by Chemical Formula 1 or 2, a photosensitive polymer, and a photocuring agent;
or a copolymer of the perfluoropolyether derivative and the photosensitive polymer, and the photocuring agent;

$$A\text{-}CF_2O(CF_2CF_2O)_m(CF_2O)_nCF_2\text{-}A \quad \text{Chemical Formula 1}$$

$$CF_3O(CF_2CF_2O)_m(CF_2O)_nCF_2\text{-}A \quad \text{Chemical Formula 2}$$

wherein A is A' or RA', in which A' is a functional group selected from the group consisting of COF, $SiX_1X_2X_3$ (where each of $X_1$, $X_2$ and $X_3$ is independently an alkyl group of about 1 to about 10 carbon atoms, and one or more of $X_1$, $X_2$ and $X_3$ are alkoxy groups of about 1 to about 10 carbon atoms, respectively), silanol, chlorosilane, carboxylic acid, alcohol, amine, phosphoric acid, and derivatives thereof, and R is a substituted or unsubstituted alkylene group of about 1 to about 30 carbon atoms, in which the substitution group is selected from the group consisting of a hydroxy group, an alkyl group of about 1 to about 10 carbon atoms, a hydroxyalkyl group, an amide group, a nitro group, an alkenyl group of about 2 to about 30 carbon atoms, an alkoxy group of about 1 to about 30 carbon atoms, and an alkoxyalkyl group of about 2 to about 30 carbon atoms, m is an integer of about 1 to about 50, and n is an integer of about 1 to about 50;

patterning the thin film through photolithography; and
developing the patterned thin film.

21. A method of fabricating an organic thin film transistor, comprising:
forming a gate electrode, a gate insulation film, source/drain electrodes, an organic semiconductor layer and a passivation layer on a substrate, wherein the passivation layer is formed according to claim 20.

22. The method according to claim 21, further comprising:
forming a bank on the source/drain electrodes, wherein the passivation layer is formed on the organic semiconductor layer and the bank.

23. A method of fabricating an electronic device comprising fabricating the organic thin film transistor according to claim 21.

* * * * *